(12) United States Patent  (10) Patent No.: US 7,605,399 B2
Kim et al.  (45) Date of Patent:  Oct. 20, 2009

(54) THIN FILM TRANSISTOR

(75) Inventors: Jong Yun Kim, Yongin-si (KR); Tae Wook Kang, Seongnam-si (KR)

(73) Assignee: Samsung Mobile Display Co., Ltd., Gyeonggi-do (KR)

( * ) Notice: Subject to any disclaimer, the term of this patent is extended or adjusted under 35 U.S.C. 154(b) by 288 days.

(21) Appl. No.: 11/509,975

(22) Filed: Aug. 25, 2006

(65) Prior Publication Data

US 2007/0045628 A1 Mar. 1, 2007

(30) Foreign Application Priority Data

Aug. 29, 2005 (KR) ............... 10-2005-0079606

(51) Int. Cl.
*H01L 29/04* (2006.01)
*H01L 31/036* (2006.01)
*H01L 31/0376* (2006.01)

(52) U.S. Cl. .............. 257/59; 257/72; 257/88; 257/99; 257/E27.005; 257/E27.111

(58) Field of Classification Search ........... 257/59, 257/66, 72, 79, 88, 99, 84, E27.005, E27.111, 257/E43.004
See application file for complete search history.

(56) References Cited

U.S. PATENT DOCUMENTS

| | | | |
|---|---|---|---|
| 5,629,553 A * | 5/1997 | Ikeda et al. ................. 257/531 |
| 6,020,223 A | 2/2000 | Mei et al. | |
| 6,545,291 B1 * | 4/2003 | Amundson et al. ............ 257/40 |
| 6,995,520 B2 * | 2/2006 | Inukai ...................... 315/169.3 |
| 2001/0028060 A1 * | 10/2001 | Yamazaki et al. ............. 257/72 |
| 2005/0001215 A1 * | 1/2005 | Koyama ...................... 257/59 |
| 2005/0056841 A1 * | 3/2005 | Yamazaki et al. ............. 257/59 |

FOREIGN PATENT DOCUMENTS

KR 10-2003-0008817 A 1/2003

\* cited by examiner

*Primary Examiner*—Shouxiang Hu
(74) *Attorney, Agent, or Firm*—Knobbe Martens Olson & Bear LLP (57) ABSTRACT

Disclosed are a thin film transistor and a method for fabricating the same. The thin film transistor is capable of a fine current control. The thin film transistor includes a semiconductor layer comprising a channel; a gate electrode overlying the semiconductor layer; a source electrode connected to a first end of the semiconductor layer; a drain electrode connected to a second end of the semiconductor layer; and a conductive line connected to one of the source and drain electrodes. The conductive line is configured to generate a magnetic field penetrating through at least a portion of the semiconductor layer when an electrical current flows through the conductive line.

23 Claims, 5 Drawing Sheets

THIN FILM TRANSISTOR

CROSS-REFERENCE TO RELATED APPLICATIONS

This application claims the benefit of Korean Patent Application No. 2005-79606, filed on Aug. 29, 2005, in the Korean Intellectual Property Office, the disclosure of which is incorporated herein by reference.

BACKGROUND

1. Field of the Invention

The present invention relates to a transistor. More particularly, the present invention relates to a thin film transistor for use in an organic light emitting display and a method for fabricating the same.

2. Discussion of Related Technology

Recently, various flat panel displays have been developed as substitutes for a Cathode Ray Tube (CRT) display which is relatively heavy and bulky. Examples of flat panel displays include a liquid crystal display (LCD), a field emission display (FED), a plasma display panel (PDP), and an organic light emitting display.

An organic light emitting display, among the flat panel displays, displays an image using an organic light emitting diode that generates light by the recombination of electrons and holes. Such an organic light emitting display has advantages of a high response speed and a low operational power consumption. The organic light emitting display can also be referred to as an organic electroluminescent display.

An active matrix organic light emitting display, among other organic light emitting displays, includes a substrate, a plurality of pixels formed on the substrate, and data and scan lines for providing video signals to the pixels. Each of the pixels is connected to a plurality of associated thin film transistors (TFTs). Each of the thin film transistors serves as either a switching element or a driving element.

Generally, a thin film transistor serving as a switching element (hereinafter, also referred to as "switching TFT") is required to have different characteristics from those of a thin film transistor serving as a driving element (hereinafter, also referred to as "driving TFT"). A switching TFT generally requires a low threshold voltage and a low sub-threshold factor. A sub-threshold factor is also referred to as an "S-factor." An S-factor is an inverse of a curve slope of a graph of source/drain current versus gate voltage. The graph generally indicates electric characteristics of a thin film transistor. A low S-factor indicates that there are only small defects in an interfacial surface between the gate insulation layer and the semiconductor layer of the thin film transistor. In other words, a low S-factor means that an interfacial surface is generally clean. On the other hand, a driving thin film transistor generally requires a relatively high S-factor because it should be capable of displaying gradation corresponding to video signals.

When a TFT has a low S-factor, a drain current may significantly change with a small variation of a gate voltage. Thus, it is difficult to perform a fine control of an electric current in a TFT. In addition, a TFT having a low S-factor may not be suitable for use as a driving TFT such as a TFT M1 shown in FIG. 1. In other words, a TFT having a small S-factor to work as a switching TFT may not work as a driving TFT.

In addition, a driving TFT used in an organic light emitting display needs gamma correction. Typically, an electric current $I_D$ flows through a drain electrode of a driving TFT to an organic light emitting diode in a pixel of an organic light emitting display. The electric current is proportional to the square of a gate voltage. Thus, the electric current and the gate voltage are in a nonlinear relationship. This nonlinear relationship is also referred to as the gamma characteristic. However, an organic light emitting display requires a linear relationship between these quantities and thus needs gamma correction to compensate the non-linear relationship.

SUMMARY OF CERTAIN INVENTIVE ASPECTS

One aspect of the invention provides a thin film transistor. The thin film transistor comprises: a semiconductor layer comprising a channel; a gate electrode overlying the semiconductor layer; a source electrode connected to a first end of the semiconductor layer; a drain electrode connected to a second end of the semiconductor layer; and a conductive line connected to at least one of the source and drain electrodes. The conductive line is configured to generate a magnetic field penetrating through at least a portion of the semiconductor layer when an electrical current flows through the conductive line.

In the thin film transistor, the channel may have an effective width, through which electronic carriers are configured to move from the source to the drain. The effective width of the channel may be configured to change depending on a magnitude of the magnetic field. The effective width of the channel may be configured to change depending on an electrical current in the conductive line. Alternatively, the effective width of the channel may be configured to change depending on a voltage applied to the gate electrode. In the thin film transistor, the effective width may be generally inversely proportional to the gate voltage.

The conductive line may comprise a portion substantially surrounding an area over a portion of the semiconductor layer. The conductive line may comprise an open loop. The loop may be U-shaped.

The thin film transistor may further comprise an insulating layer over the semiconductor layer and the gate electrode may be formed on the insulating layer. The conductive line may comprise a portion formed on the insulating layer. The conductive line may comprise a portion substantially surrounding the gate electrode while not electrically contacting the gate electrode.

Another aspect of the invention provides a method of operating a thin film transistor. The method comprises: providing the thin film transistor described above; and applying to the gate electrode a gate voltage sufficient to create a channel in the semiconductor layer, whereby an electrical current flows from the source toward the drain, thereby flowing the electrical current through the conductive line. The electrical current generates a magnetic field penetrating through at least a portion of the semiconductor layer.

In the method, the channel may have an effective width, through which electronic carriers move from the source to the drain. The effective width may change depending on a magnitude of the magnetic field. The effective width may change as the electric current changes. Alternatively, the effective width may change as the gate voltage changes. The effective width may be generally inversely proportional to the gate voltage.

Yet another aspect of the invention provides an electronic device. The electronic device comprises an electronic circuit and the thin film transistor described above and electrically connected to the electronic circuit. The electronic device may comprise a display device, which comprises a matrix of display elements. The matrix of display elements may comprise an organic light emitting diode, and the conductive line may be connected to the organic light emitting diode. The matrix may comprise a pixel circuit comprising a switching transistor and a driving transistor. The driving transistor may pass a pixel driving current when turned on and the switching transistor may switch the driving transistor. The driving transistor may comprise the thin film transistor described above. The switching transistor may further comprise the thin film transistor described above.

Another aspect of the invention provides a thin film transistor and a method for fabrication the same, which easily perform a minute or fine current control of a driving thin film transistor by forming a shape of a drain electrode in such a manner that a part of the drain electrode overlaps with a semiconductor layer and another part thereof surrounds the semiconductor layer to form a partially magnetic field on a channel of a semiconductor layer by an electric current flowing in a drain electrode, thereby reducing effective moving width of a carrier passing a channel of a semiconductor layer, in the driving thin film transistor included in a pixel of an organic light emitting display.

The thin film transistor comprises: a semiconductor layer formed on a substrate; a gate electrode formed on the semiconductor layer; and source and drain electrodes, predetermined parts of the source and drain electrodes contact with both side ends of the semiconductor layer, respectively, wherein the drain electrode is formed at one side of the semiconductor layer in such a manner that a part of the drain electrode overlaps with the semiconductor layer and another part thereof surrounds the semiconductor layer.

Preferably, the drain electrode includes a first electrode portion connected to an organic light emitting diode, a second electrode portion overlapping with the semiconductor layer, and a third electrode portion formed at one side end of the semiconductor layer to surround the semiconductor layer, and wherein the first, second, and third electrode portions are electrically connected to each other.

More preferably, an electric current flowing in a drain electrode forms a partially magnetic field on a channel of a semiconductor layer, thereby reducing real valid moving width of a carrier passing the channel of the semiconductor layer. More preferably, the thin film transistor is a driving thin film transistor included in each pixel of an organic light emitting display. Also, a gate dielectric layer is formed between the semiconductor layer and the gate electrode.

Another aspect of the invention provides a method for fabrication a thin film transistor. The method comprises: forming a semiconductor layer on a substrate; forming a gate dielectric layer on the semiconductor layer, and forming a gate electrode formed on the gate dielectric layer; and forming source and drain electrodes at both ends of the semiconductor layer so that predetermined parts of the source and drain electrodes contact with both side ends of the semiconductor layer, respectively, wherein the drain electrode is formed at one side of the semiconductor layer in such a manner that a part of the drain electrode overlaps with the semiconductor layer and another part thereof surrounds the semiconductor layer.

Preferably, the drain electrode may include a first electrode portion connected to an organic light emitting diode, a second electrode portion overlapping with the semiconductor layer, and a third electrode portion formed at one side end of the semiconductor layer to surround the semiconductor layer, and the first, second, and third electrode portions are electrically connected to each other.

BRIEF DESCRIPTION OF THE DRAWINGS

Various aspects and advantages of the invention will become apparent and more readily appreciated from the following description, taken in conjunction with the accompanying drawings.

DETAILED DESCRIPTION OF CERTAIN INVENTIVE EMBODIMENTS

An organic light emitting display and a method for fabricating the same according to embodiments of the invention will be described in detail with reference to the accompanying drawings. In the drawings, like reference numerals indicate identical or functionally similar elements.

Figure 1:
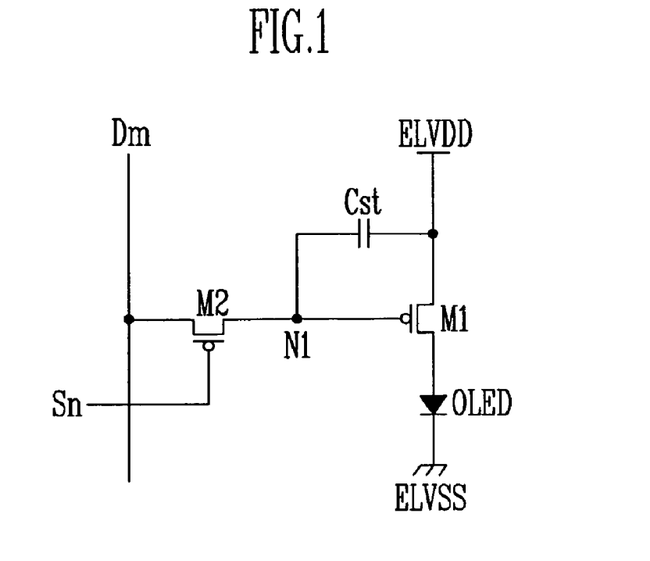
FIG. 1 is a circuit diagram of an embodiment of a pixel of an organic light emitting display.

FIG. 1 is a typical circuit diagram illustrating an embodiment of a pixel of an organic light emitting display. The circuit includes a pixel circuit and an organic light emitting diode OLED. The pixel circuit includes a first transistor M1 serving as a driving element, a second transistor M2 serving as a switching element and a capacitor Cst.

The first transistor M1 includes a source electrode connected to a first power supply line ELVdd, a drain electrode connected to the organic light emitting diode OLED, and a gate electrode connected to a first node N1. In the first transistor M1, an electric current flows from the source electrode to the drain electrode according to a voltage applied to the first node N1.

The second transistor M2 has a source electrode connected to a data line Dm, a drain electrode connected to the first node N1, and a gate electrode connected to a scan line Sn. The second transistor M2 is configured to selectively transfer a data signal from the data line Dm to the first node N1 according to the scan signal provided through the scan line Sn.

The capacitor Cst has a first terminal connected to the first power supply line ELVdd and a second terminal connected to the first node N1. The capacitor Cst is configured to maintain a voltage difference between the gate and source electrodes of the first transistor M1 for a predetermined period of time. When the transistor M2 is on, the voltage difference between the gate and source electrodes of the first transistor M1 may be expressed by Equation 1 below:

$$Vgs = |Vdata - ELVdd| \qquad \text{Equation 1}$$

In Equation 1, Vgs is a gate-source voltage difference of the first transistor M1. ELVdd is a voltage of the first power supply line ELVdd. Vdata is the voltage of a data signal.

An electric current $I_D$ flows from the drain electrode of the first transistor M1 to the organic light emitting diode OLED when the transistor M1 is on. The electric current $I_D$ is expressed by Equation 2 below:

$$I_D = \frac{k_n}{2}(V_{gs} - V_T)^2,$$ Equation 2

$$k_n = \mu_n C_{ox} \frac{W}{L}$$

Vgs is a gate-source voltage difference of the first transistor M1. In addition, $V_T$ is a threshold voltage of the first transistor M1. W is the channel width of the first transistor M1, and L is the channel length of the first transistor M1.

In the illustrated organic light emitting diode, when the scan signal is low, the second transistor M2 is turned on, thereby supplying the video data signal to the gate electrode of the first transistor M1 via the second transistor M2. Then, because of the voltage difference Vgs, an electric current flows through the first transistor M1 and to the organic light emitting diode (OLED). When the current flows through the organic light emitting diode, the diode emits light.

As shown in Equation 2, the electric current $I_D$ is proportional to the square of the voltage, $V_{gs}-V_T$. Thus, an current-voltage (I-V) curve of the thin film transistor M1 is non-linear. However, for a fine control of level of illumination, it is required to provide a linear relationship between the current and the voltage difference. Thus, gamma compensation is required to correct the non-linearity between the current and the voltage difference.

In one embodiment, a driving thin film transistor for an organic light emitting display pixel includes a semiconductor layer serving as a channel for electronic carriers; a gate electrode; a source electrode; and a drain electrode. In addition, the thin film transistor further includes a conductive line or wiring connected to at least one of the source and drain electrodes. The conductive line is configured to generate a magnetic field penetrating through at least a portion of the semiconductor layer when an electrical current flows through the conductive line. This configuration may reduce an effective channel width for the electronic carriers, and thus compensates the non-linearity.

Figure 2A:
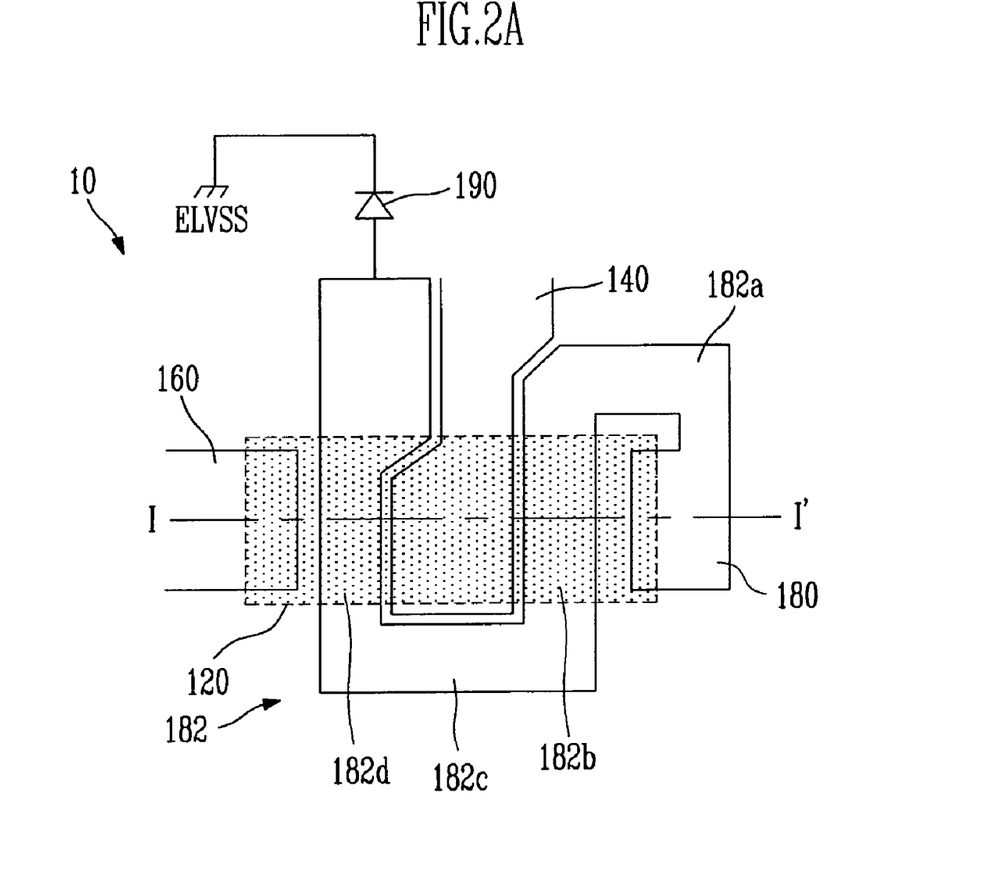
FIG. 2A is a top plan view of one embodiment of a thin film transistor.
Figure 2B:
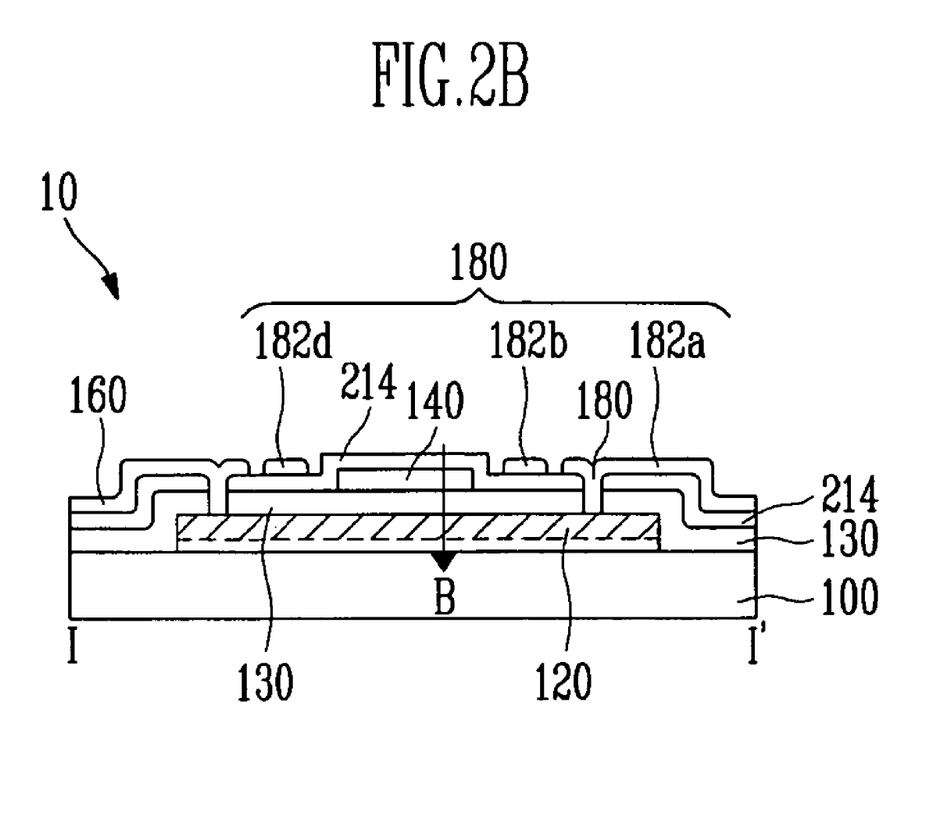
FIG. 2B is a schematic cross-section of the thin film transistor of FIG. 2A taken along the line I-I'.

FIGS. 2A and 2B illustrate a thin film transistor 10 according to an embodiment. The illustrated thin film transistor can serve as a driving TFT in the organic light emitting display pixel of FIG. 1.

FIG. 2A is a schematic top plan view of the thin film transistor 10. The illustrated thin film transistor 10 has a semiconductor layer 120 extending in a first direction and a gate electrode 140 extending in a second direction generally perpendicular to the first direction. The gate electrode 140 is configured to overlie the semiconductor layer 120. A gate dielectric layer 130 (see FIG. 2B) is interposed and insulates between the semiconductor layer 120 and the gate electrode 140. The thin film transistor 10 also includes a source electrode 160 electrically connected to one end of the semiconductor layer 120 and a drain electrode 180 electrically connected to the other end of the semiconductor layer 120. In addition, another insulation layer 214 is configured to cover top surfaces of the gate electrode 140 and the gate dielectric layer 130.

The illustrated thin film transistor 10 has a conductive line 182 configured to generate a magnetic field penetrating through the semiconductor layer 120, either in the general direction from the top to the bottom or in the opposite direction from the bottom to the top of the semiconductor layer 120. The directions of the magnetic field may be different from embodiment to embodiment. The conductive line 182 may be in a form of a loop lying over the semiconductor layer 120. The loop may be a closed or open loop. The illustrated conductive line 182 has an open loop structure similar to a U-shape, as shown in FIG. 2A. The conductive line 182 is formed over the insulation layer 214, and is connected to the drain electrode 180. In other embodiments, the conductive line may be connected to the source electrode 160 or both of the source and drain electrodes.

FIG. 2A illustrates a conductive line structure according to an embodiment. In FIG. 2A, the conductive line 182 is connected to the drain electrode 180 which is in contact with a right end of the underlying semiconductor layer 120. The conductive line 182 extends upward from the drain electrode 180 and then to the left on the drawing sheet. Then, the conductive line 182 extends downward and crosses over the semiconductor layer 120. The conductive line 182 then extends to the left and then upward, crossing again over the semiconductor layer 120, surrounding the gate electrode 140. The conductive line 182 is not in electrical contact with the gate electrode 140. The conductive line 182 is electrically connected to an organic light emitting diode 190.

In other words, the drain electrode 180 includes conductive portions 182a-182d extending from the drain electrode 180 to the organic light emitting diode 190. As shown in FIG. 2A, a first conductive portion 182a extends horizontally and is connected to the drain electrode 180. Second and fourth conductive portions 182b and 182d are configured to cross over the semiconductor layer 120. A third-conductive portion 182c interconnects the second and fourth conductive portions 184b and 184d. The fourth conductive portion 182d is also connected to an external device, which is the organic light emitting diode in the illustrated embodiment. The conductive portions 182a-182d are all electrically connected to each other. In other embodiments, the fourth conductive portion 182d may be connected to any other type of circuit elements.

During operation of the thin film transistor, an output electric current flows from the drain electrode 180 through the conductive line 182 to the organic light emitting diode 190. While flowing through the conductive line, the electric current produces a magnetic field penetrating through the semiconductor layer 120 which serves as a channel for electronic carriers. The magnetic field creates a force exerting onto the electronic carriers moving through the magnetic field. Since this force pushes the carriers passing through the channel in a direction generally perpendicular to the direction of the carrier movement, it reduces the effective channel width for the carriers. This configuration compensates the non-linear relationship between the output electric current and an input voltage of the thin film transistor as explained below.

According to Equation 2, the electric current $I_D$ is proportional to the channel width W of a thin film transistor. In Equation 2, the channel width W of a conventional thin film transistor is a constant. In the illustrated embodiment, however, the channel width W decreases as a magnetic field generated by the electric current $I_D$ increases. As noted above, the electric current $I_D$ is proportional to a square of the voltage $V_{gs}-V_T$. In the illustrated embodiment, however, because the effective channel width decreases as $I_D$ increases, the nonlinearity of current versus voltage $V_{gs}-V_T$ can be compensated.

Figure 3A:
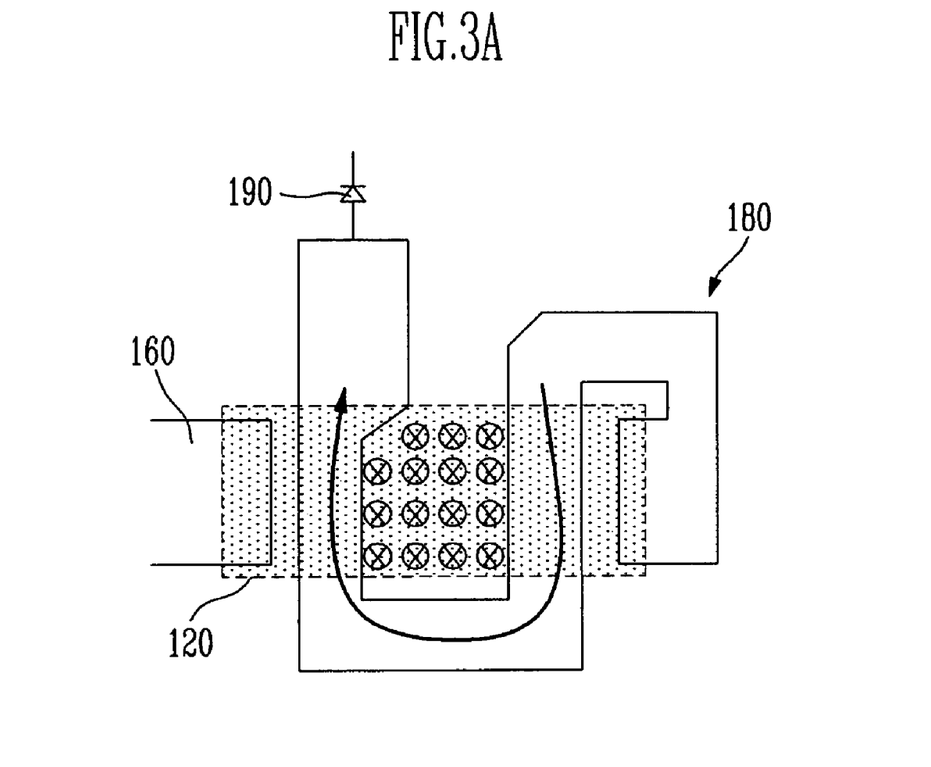
FIGS. 3A and 3B illustrate a reduced effective channel width of the thin film transistor of FIG. 2.
Figure 3B:
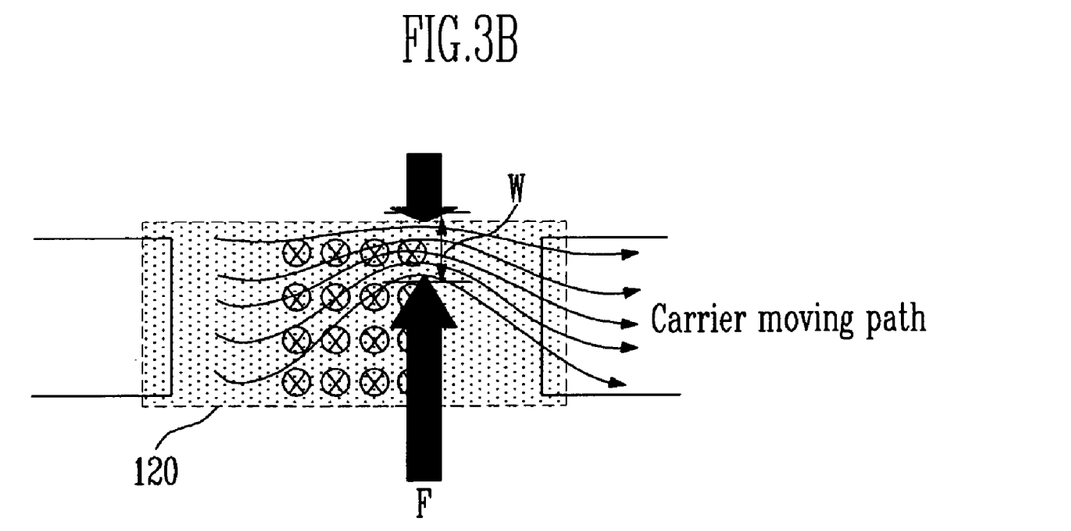

FIGS. 3A and 3B illustrate how an effective channel width can be reduced in the thin film transistor of FIG. 2. In FIG. 3A, an electric current $I_D$ flows from the right end of the semiconductor layer 120 through the drain electrode 180 and the conductive line 182 to the organic light emitting diode 190. The current $I_D$ turns clockwise and generates a magnetic field while passing through the conductive line or wiring 182. The magnetic field (FIG. 2B) penetrates the semiconductor layer 120 from the front to the back of sheet on which FIG. 3A is drawn. Under Ampere's law, a path integral of a magnetic force around any (imaginary) closed path is equal to the current enclosed by the path, multiplied by $\mu_0$, as shown in Equation 3:

$$\oint B \cdot ds = \mu_0 I_{enclosed}.$$ Equation 3

During operation of the thin film transistor, a current flows from the source electrode 160 through the semiconductor layer 120 (the channel) to the drain electrode 180. Depending on the type of the semiconductor, either holes or electrons serve as electronic carriers. In the illustrated embodiment, the electronic carriers are holes and move to the right when the thin film transistor is in operation. Under the Lorentz force law, a force (so-called Lorentz force) is exerted on a moving charge which is subject to a magnetic field. The Lorentz force F moves the electronic carriers (holes in the illustrated embodiment) upward, as shown in FIG. 3B. Accordingly, the effective channel width for the electronic carriers is reduced as illustrated. In this manner, the channel width W of the thin film transistor M1 becomes a variable, not a fixed value, in Equation 2.

As the electric current $I_D$ increases, the magnetic force B increases. As the magnetic force B increases, the Lorentz force F increases, thereby reducing the effective channel width W. Therefore, the effective channel width W decreases as the electric current $I_D$ increases. Although the electric current $I_D$ is proportional to the square of the voltage $V_{gs}-V_{Tg}$, the reduced effective channel width W decreases the electric current $I_D$. In this manner, the thin film transistor compensates the non-linearity of the I-V relationship and thus allows a fine control of the electric current.

In addition, a driving TFT according to embodiments of the invention can have the S-factor as low as a switching TFT because the fine current control of the driving TFT can be possible even if it has a low S-factor. Therefore, the same manufacturing process can be used to create both driving and switching TFTs at the same time, as such can be used in producing the OLED pixel of FIG. 1. As a result, the manufacturing process can be simplified. By way of example, the illustrated thin film transistor is used for an organic light emitting display pixel, as shown in FIG. 1. In other embodiments, the thin film transistor can be used for various other types of circuit elements.

FIGS. 4A-4D illustrate an exemplary method for fabricating the thin film transistor of FIG. 2. Each of FIGS. 4A-4D includes a top plan view of a thin film transistor structure at each step on the left and a cross-sectional view of the thin film transistor structure taken along a line I-I'.

Figure 4A:
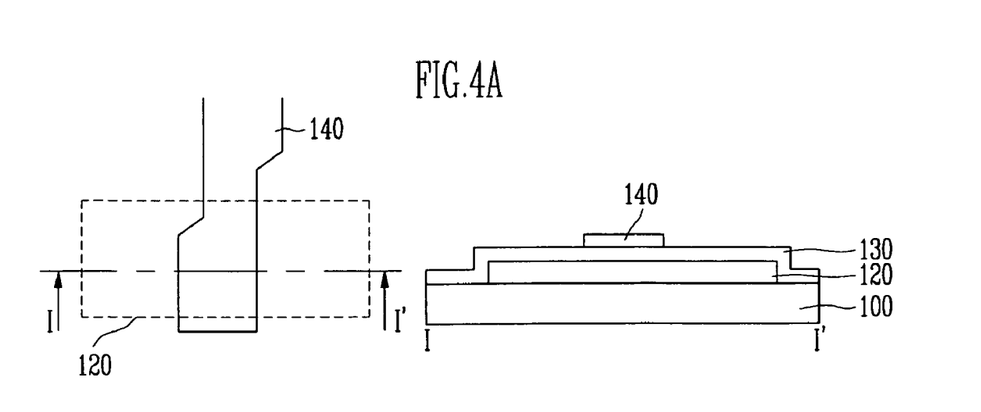
FIGS. 4A to 4D illustrate a method for fabricating the thin film transistor of FIG. 2 according to an embodiment.

Referring to FIG. 4A, a buffer film (not shown) is formed over a substrate 100 in order to protect a thin film transistor which will be formed thereover. The buffer film prevents impurities from diffusing from the substrate 100 into the thin film transistor. The buffer film may be formed of silicon oxide or silicon nitride.

Subsequently, an amorphous silicon layer is formed over the buffer film. The amorphous silicon layer is then crystallized using a suitable process such as excimer laser annealing (ELA), sequential lateral solidification (SLS), metal induced crystallization (MIC), or metal induced lateral crystallization (MILC). By this step, the amorphous silicon is transformed into polysilicon.

Then, a photoresist is provided over the polysilicon layer and is patterned to provide a mask for the polysilicon layer. Then, the polysilicon layer is etched using the photoresist as a mask, thereby forming a semiconductor layer 120.

Subsequently, a gate dielectric layer 130 is formed over the semiconductor layer 120 and exposed surfaces of the substrate 100. In one embodiment, the gate dielectric layer 130 may be formed of silicon oxide or silicon nitride. Next, a material for a gate electrode is deposited on the gate dielectric layer 130, and is patterned to form a gate electrode 140.

Figure 4B:
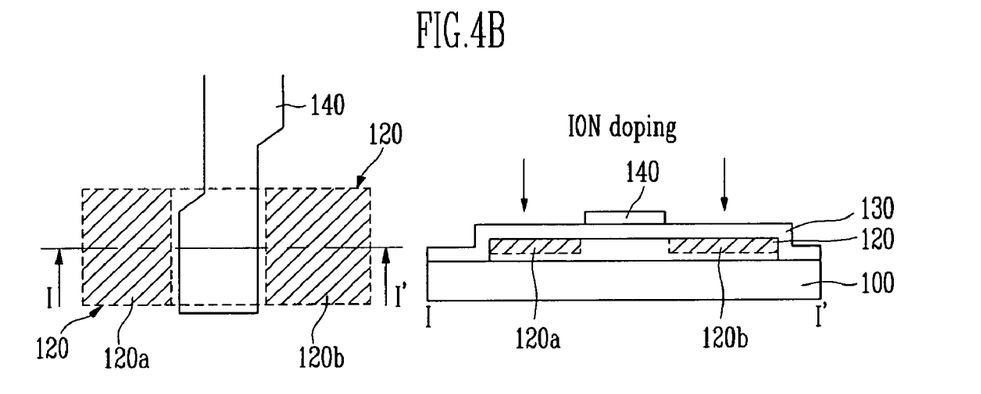

Then, as shown in FIG. 4B, impurities are implanted in the semiconductor layer 120 by using the gate electrode 140 as a mask, thereby forming source and drain regions 120a and 120b in the semiconductor layer 120. A region between the source and drain regions 120a and 120b serves as a channel region.

Figure 4C:
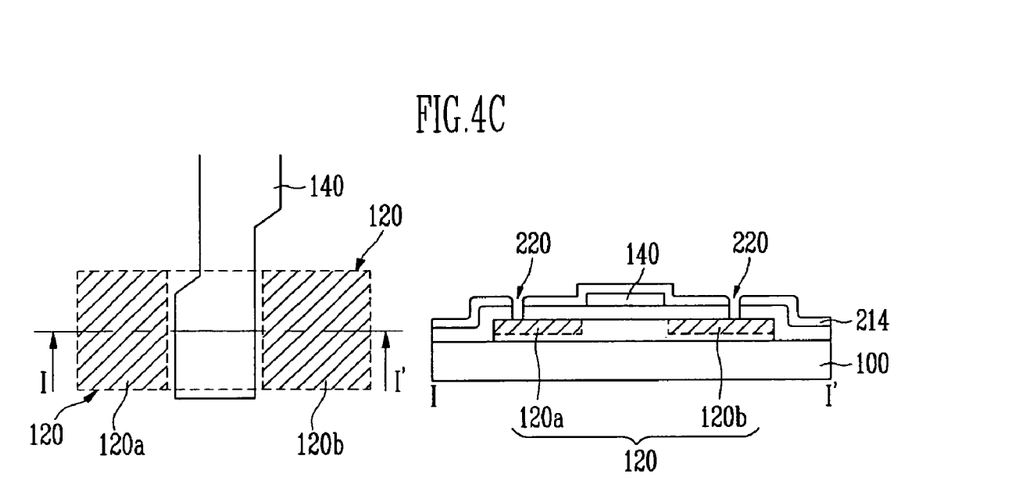

Next, a dielectric or insulation layer 214 is formed over the exposed surfaces of the gate electrode 140 and the gate dielectric layer 130. The dielectric layer 214 may be formed of silicon nitride or silicon oxide. Then, contact holes 220 are etched through the dielectric layer 214 down to the source and drain regions 120a and 120b, as shown in FIG. 4C. These contact holes 220 will be used to connect the source and drain regions 120a and 120b to source and drain electrodes 160 and 180.

Figure 4D:
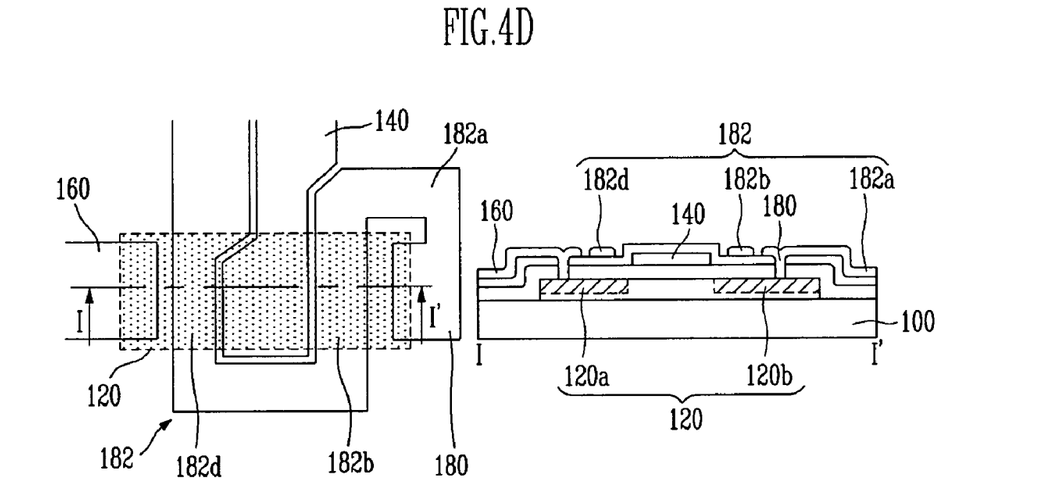

Finally, with reference to FIG. 4D, a layer of an electrode material is provided over the dielectric layer 214 and into the contact holes 220. Then, the electrode material layer is patterned to form the source and drain electrodes 160 and 180. As shown in FIG. 4D, the source and drain electrodes 160 and 180 are formed in the source and drain contact holes 220 to contact the source and drain regions 120a and 120b, respectively.

In addition, a conductive line 182 is also patterned over the semiconductor layer 120 in a loop form, surrounding the gate electrode 140, as shown in FIG. 4D. In the illustrated embodiment, the conductive line 182 includes a U-shaped open-loop portion over the semiconductor layer 120. In other embodiments, the conductive line 182 may have a different shape such as an O-shape. The illustrated conductive line is connected to the drain electrode 180. In certain embodiments, the conductive line 182 may be connected to the source electrode 160. In other embodiment, the conductive line may be connected to both of the source and drain electrodes. A skilled artisan will appreciate that various configurations of conductive lines can be used to generate a magnetic field penetrating through the semiconductor layer 120.

Although various embodiments of the invention have been shown and described, it will be appreciated by those technologists in the art that changes might be made in these embodiments without departing from the principles and spirit of the invention, the scope of which is defined in the claims and their equivalents.

What is claimed is:

1. A thin film transistor, comprising:
  a semiconductor layer comprising a channel;
  a gate electrode overlying the semiconductor layer;
  a source electrode connected to a first end of the semiconductor layer;
  a drain electrode connected to a second end of the semiconductor layer; and
  a conductive line connected to one of the source and drain electrodes, the conductive line comprising at least one portion that crosses the channel of the semiconductor layer at least twice, the conductive line being configured to generate a magnetic field penetrating through at least a portion of the channel of the semiconductor layer when an electrical current flows through the conductive line.

2. The thin film transistor of claim 1, wherein the channel has an effective width, through which electronic carriers are configured to move from the source to the drain, and wherein the effective width of the channel is configured to change depending on a magnitude of the magnetic field.

3. The thin film transistor of claim 1, wherein channel has an effective width, through which electronic carriers are configured to move from the source to the drain, and wherein the effective width of the channel is configured to change depending on the electrical current in the conductive line.

4. The thin film transistor of claim 1, wherein channel has an effective width through which electronic carriers are configured to move from the source to the drain, and wherein the effective width of the channel is configured to change depending on a voltage applied to the gate electrode.

5. The thin film transistor of claim 4, wherein the effective width is generally inversely proportional to the gate voltage.

6. The thin film transistor of claim 1, wherein the conductive line comprises a portion substantially surrounding an area over a portion of the semiconductor layer.

7. The thin film transistor of claim 1, wherein the conductive line comprises an open loop.

8. The thin film transistor of claim 7, wherein the loop is U-shaped.

9. The thin film transistor of claim 1, further comprising an insulating layer over the semiconductor layer, wherein the gate electrode is formed on the insulating layer.

10. The thin film transistor of claim 9, wherein the conductive line comprises a portion formed on the insulating layer.

11. The thin film transistor of claim 9, wherein the conductive line comprises a portion substantially surrounding the gate electrode while not electrically contacting the gate electrode.

12. A method of operating a thin film transistor, the method comprising:
provide the thin film transistor of claim 1; and
applying to the gate electrode a gate voltage sufficient to create a channel in the semiconductor layer, whereby an electrical current flows from the source toward the drain, thereby flowing the electrical current through the conductive line,
wherein the electrical current generates a magnetic field penetrating through at least a portion of the semiconductor layer.

13. The method of claim 12, wherein the channel has an effective width, through which electronic carriers move from the source to the drain, and wherein the effective width changes depending on a magnitude of the magnetic field.

14. The method of claim 12, wherein the channel has an effective width, through which electronic carriers move from the source to the drain, wherein the effective width changes as the electric current changes.

15. The method of claim 12, wherein the channel has an effective width through which electronic carriers move from the source to the drain, wherein the effective width changes as the gate voltage changes.

16. The method of claim 15, wherein the effective width is generally inversely proportional to the gate voltage.

17. An electronic device comprising an electronic circuit and the thin film transistor of claim 1 electrically connected to the electronic circuit.

18. The electronic device of claim 17, comprising a display device, which comprises a matrix of display elements.

19. The electronic device of claim 18, wherein the matrix of display elements comprises an organic light emitting diode, and wherein the conductive line is connected to the organic light emitting diode.

20. The electronic device of claim 18, wherein the matrix comprises a pixel circuit comprising a switching transistor and a driving transistor, the driving transistor passing a pixel driving current when turned on, the switching transistor switching the driving transistor, wherein the driving transistor comprises the thin film transistor of claim 1.

21. The electronic device of claim 20, wherein the switching transistor further comprises the thin film transistor of claim 1.

22. The thin film transistor of claim 1, wherein the conductive line comprises:
a first portion connected to one of the source and drain electrodes, the first portion extending on a first side of the semiconductor layer without crossing the semiconductor layer when viewed from above; and
a second portion connected to the first portion, the second portion crossing the semiconductor layer from the first side of the semiconductor layer to a second side of the semiconductor layer when viewed from above, the second side of the semiconductor layer being opposite from the first side of the semiconductor layer.

23. The thin film transistor of claim 22, wherein the conductive line further comprises:
a third portion connected to the second portion, the third portion extending on the second side of the semiconductor layer without crossing the semiconductor layer when viewed from above; and
a fourth portion connected to the third portion, the fourth portion crossing the semiconductor layer from the second side of the semiconductor layer to the first side of the semiconductor layer when viewed from above.

* * * * *